(12) United States Patent
Leobandung

(10) Patent No.: US 8,841,726 B2
(45) Date of Patent: Sep. 23, 2014

(54) SELF-ADJUSTING GATE HARD MASK

(71) Applicant: International Business Machines Corporation, Armonk, NY (US)

(72) Inventor: Effendi Leobandung, Wappingers Falls, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 13/962,245

(22) Filed: Aug. 8, 2013

(65) Prior Publication Data
US 2014/0210005 A1 Jul. 31, 2014

Related U.S. Application Data

(63) Continuation of application No. 13/755,446, filed on Jan. 31, 2013.

(51) Int. Cl.
*H01L 27/12* (2006.01)

(52) U.S. Cl.
USPC .... 257/347; 257/351; 257/369; 257/E21.444; 257/E21.453

(58) Field of Classification Search
USPC .......... 438/692, 697, 699; 257/351, E21.304
See application file for complete search history.

(56) References Cited

U.S. PATENT DOCUMENTS

| 5,893,750 | A | 4/1999 | Hause et al. |
| 8,114,746 | B2 | 2/2012 | Wei et al. |
| 8,153,526 | B2 | 4/2012 | Lee et al. |
| 8,319,290 | B2 | 11/2012 | Grebs |
| 2009/0087974 | A1* | 4/2009 | Waite et al. ................... 438/592 |
| 2012/0052666 | A1 | 3/2012 | Choi |
| 2012/0196425 | A1 | 8/2012 | Scheiper et al. |
| 2013/0221413 | A1* | 8/2013 | Jagannathan et al. ........ 257/288 |
| 2014/0065809 | A1* | 3/2014 | Kim et al. ..................... 438/586 |

* cited by examiner

*Primary Examiner* — Daniel Whalen
(74) *Attorney, Agent, or Firm* — Harrington & Smith; Louis J. Percello

(57) ABSTRACT

An intermediate wafer includes a substrate having a surface and a first dummy gate plug disposed upon a structure, e.g., a FIN, supported by the substrate surface; a second dummy gate plug disposed upon the substrate surface; and a first layer in which the first dummy gate plug and the second dummy gate plug are embedded. The first layer exhibits a non-planar surface topography characterized by a depression due at least to a presence of the first dummy gate plug. The structure further includes a second layer that fills the depression to the surface of the first layer, and a third layer that overlies the first layer and the second layer. The third layer is formed of a hard mask material and has a substantially planar surface topography over the first and second dummy gate plugs and over the depression that is filled with the material of the second layer.

6 Claims, 4 Drawing Sheets

SELF-ADJUSTING GATE HARD MASK

CROSS-REFERENCE TO A RELATED PATENT APPLICATION

This patent application is a continuation patent application of copending U.S. patent application Ser. No. 13/755,446, filed Jan. 31, 2013, the disclosure of which is incorporated by reference herein in its entirety.

TECHNICAL FIELD

The examples of the embodiments of this invention relate generally to semiconductor device fabrication techniques and, more specifically, relate to the fabrication of FINFET semiconductor devices and to replacement gate (RG) semiconductor device methodologies.

BACKGROUND

A FIN-geometry field effect transistor (FINFET) is one type of three dimensional (3D) device that presents topography challenges during fabrication. This can be especially true when a Replacement Metal Gate (RMG) process is performed where wafer surface planarity is important. Attempted improvements to conventional chemical-mechanical polish, also known as chemical-mechanical planarization, (CMP) processes have been found to not adequately address the issues related to a lack of adequate surface planarity.

SUMMARY

In a first exemplary embodiment of this invention a method provides an intermediate semiconductor device structure and includes providing a wafer having first dummy gate plugs and second dummy gate plugs embedded in a first layer having a non-planar wafer surface topography due at least to a presence of the first dummy gate plugs; depositing at least one second layer over the first layer, the at least one second layer comprising a hard mask material; and removing at least a portion of the second layer to form a substantially planar wafer surface topography over the first dummy gate plugs and the second dummy gate plugs prior to gate conductor deposition.

In another exemplary embodiment of this invention a method to process a wafer during fabrication of devices on the wafer comprises providing a wafer having a surface upon which a FIN structure is disposed. The wafer comprises a first dummy gate plug disposed upon the FIN structure and a second dummy gate plug disposed upon the wafer surface. The wafer further comprises a conformally deposited first layer in which the first and the second dummy gate plugs are embedded. The first layer exhibits a non-planar surface topography characterized by a depression due at least to a presence of the first dummy gate plug that is disposed upon the FIN structure. The method further comprises depositing a second layer over the first layer; removing the second layer to a surface of the first layer leaving a portion of the second layer within the depression; and depositing a third layer comprised of a hard mask nitride over the surface of the first layer and the portion of the second layer within the depression. The third layer has a substantially planar surface topography over the first dummy gate plug and over the second dummy gate plug and is deposited prior to hard mask definition over the first dummy gate plug and over the second dummy gate plug, removal of the first dummy gate plug and the second dummy gate plug and the defined hard masks, and gate metal deposition.

In another exemplary embodiment of this invention a method to process a wafer during fabrication of devices on the wafer comprises providing a wafer having a surface upon which a FIN structure is disposed. The wafer comprises a first dummy gate plug disposed upon the FIN structure and a second dummy gate plug disposed upon the wafer surface. The wafer further comprises a conformally deposited first layer in which the first and the second dummy gate plugs are embedded. The first layer exhibits a non-planar surface topography characterized by a depression due at least to a presence of the first dummy gate plug that is disposed upon the FIN structure. The method further comprises depositing a second layer over the first layer; depositing a third layer over the second layer, the second layer and the third layer also exhibiting a non-planar surface topography characterized by the presence of the depression in the first layer; removing the third layer to a surface of the second layer leaving a portion of the third layer within the depression; removing the second layer and the portion of the third layer to a surface of the first layer leaving a portion of the second layer within the depression; and depositing a fourth layer comprised of a hard mask nitride over the surface of the first layer and the portion of the second layer within the depression. The fourth layer has a substantially planar surface topography over the first dummy gate plug and over the second dummy gate plug and is deposited prior to hard mask definition over the first dummy gate plug and over the second dummy gate plug, removal of the first dummy gate plug and the second dummy gate plug and the defined hard masks, and gate metal deposition.

In accordance with yet another exemplary embodiment of this invention an intermediate wafer structure comprises a substrate having a surface upon which a structure is disposed; a first dummy gate plug disposed upon the structure; a second dummy gate plug disposed upon the substrate surface; a first layer in which the first dummy gate plug and the second dummy gate plug are embedded, the first layer exhibiting a non-planar surface topography characterized by a depression due at least to a presence of the first dummy gate plug that is disposed upon the structure; a second layer comprised of a material that fills the depression to the surface of the first layer; and a third layer overlying the first layer and the second layer. The third layer is comprised of a hard mask material and has a substantially planar surface topography over the first dummy gate plug, over the second dummy gate plug, and over the depression that is filled with the material of the second layer.

DETAILED DESCRIPTION

The embodiments of this invention address and the solve the problems noted above by providing what may be referred to as a self-adjusting variable gate hard mask thickness in order to compensate for topography variations and for a lack of planarity in a semiconductor wafer, thereby facilitating the performance of polysilicon (poly) open CMP and RMG processes during device fabrication on the wafer.

Figure 1A:
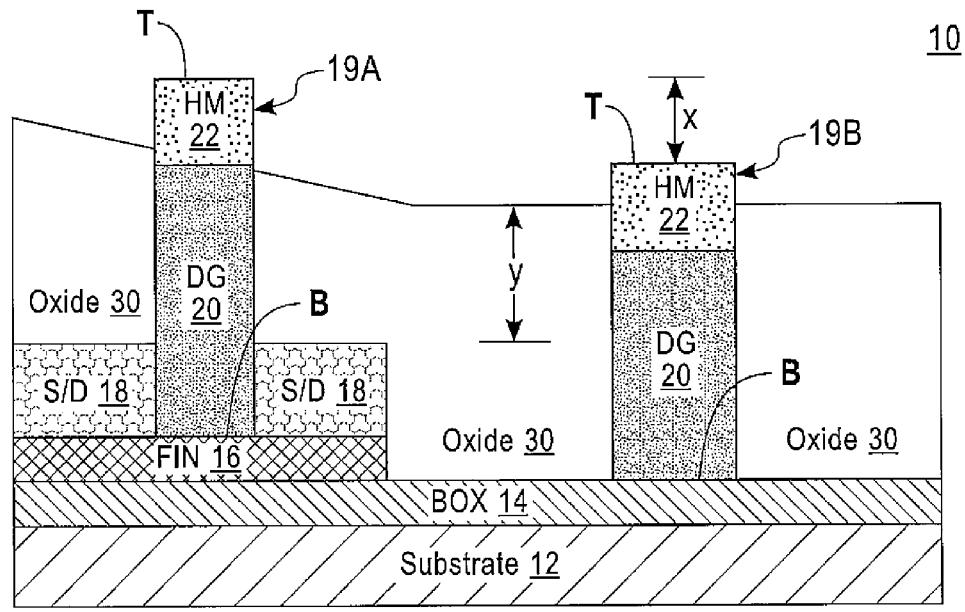
FIGS. 1A and 1B, collectively referred to as FIG. 1, are useful for explaining a problem that is addressed and solved by this invention, and show a portion of an exemplary silicon-on-insulator (SOI) wafer in cross-section with thicknesses not drawn to scale.

FIG. 1 is useful for explaining a problem that is addressed and solved by this invention. In FIG. 1A a portion of an exemplary silicon-on-insulator (SOI) wafer 10, such as an extremely thin SOI (ETSOI) wafer, is seen in cross-section with thicknesses not drawn to scale. The illustrated structure includes a substrate 12, an overlying layer of buried oxide (BOX) 14 and a partially fabricated FINFET structure composed of a FIN 16, epitaxially formed source/drains (epi S/Ds) 18 and a gate precursor structure 19A formed as a dummy gate (DG) 20 (dummy gate plug) having an overlying gate hard mask (HM) 22. An additional gate precursor structure 19B is also shown, e.g., one that can be used to form an auxiliary gate that would connect to the gate disposed on the FIN 16. The additional gate precursor structure 19B terminates on the BOX 14. Overlying these various structures is a layer of oxide 30, and the various structures may be considered to be at least partially embedded within the layer of oxide 30. Note that due to the varying topography resulting from at least the presence of the FIN 16 the surface of oxide layer 30, which can be formed using some type of conformal, blanket deposition process, is non-planar across the portion of the wafer 10.

Representative and non-limiting examples of materials and dimensions can be as follows. The FIN 16 can be formed from a patterned portion of a silicon (Si) layer that initially overlies the BOX 14 and can have a thickness (height) in a range of, for example, about 10 nm to about 50 nm. The epi S/Ds 18 can be Si (doped as needed) and can have a thickness of about 30 nm. The DGs 20 can be polysilicon (poly) plugs and can have a thickness of about 100 nm. The HMs 22 can be a nitride and can have a thickness in a range of about 30 nm to about 100 nm. The gate precursor structures 19A and 19B can have approximately equal vertical dimensions, i.e., approximately equal heights as measured from the bottom (B) to the top (T) of the gate precursor structures 19A and 19B. The vertical dimension (height) of each gate precursor structure 19 is comprised of the thickness of the dummy gate plug 20 and the thickness of the overlying HM 22. The BOX 14 and substrate 12 can have any desired thicknesses. Note that the use of an SOI wafer is optional, and in some embodiments the various transistors and other devices could instead be formed directly on and/or in the substrate 12, e.g., a Si substrate (e.g., a bulk Si substrate).

Current RMG processes when using FINFETs with a relatively large non-uniform planarity can exhibit a very small process window when planarizing processes such as CMP are to be used. The X dimension topography shown in FIG. 1A is related to the FIN topography and can result in the Y dimension being too small to accommodate the CMP process window.

Figure 1B:
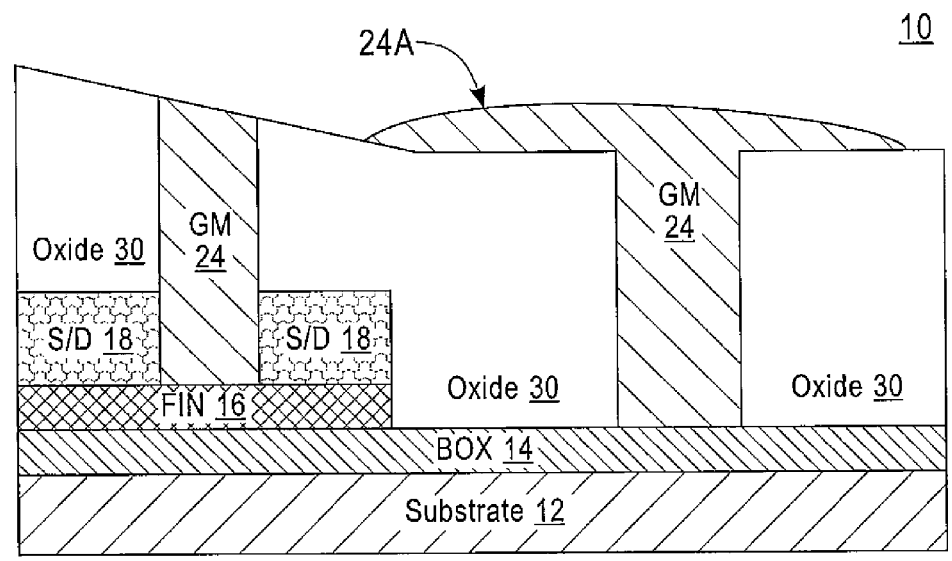

A result of this topography-related mismatch is shown in FIG. 1B, where after removal of the DG 20 and HM 22 and a CMP process, the resulting gate conductor deposition, e.g., gate metal (GM) 24 deposition such as Tungsten, can result in the formation of an undesirable GM "puddle" 24A on the surface of the oxide layer 30. The GM puddle 24A results at least in part from the topography variation between the FIN and non-FIN portions of the wafer 10.

Exemplary embodiments of this invention are illustrated in FIG. 2 (a first embodiment) and FIG. 3 (a second embodiment). It is noted that the view shown in FIG. 1 is perpendicular to the length of the FIN 16, while the views of FIGS. 2 and 3 are parallel to length of the FINs, i.e., the FINs are shown end-on and the width, not the length, of the FIN is depicted.

FIGS. 2 and 3 both show a portion of the wafer 10 at a post-dummy gate deposition processing point. It is assumed that there is a substrate 40 (e.g., the substrate 12 and BOX 14 of FIG. 1) and a plurality of the dummy gates 20 sitting atop FINs 16, shown for simplicity as structures 42. The structures 42 are covered with a layer of material 44 such as an oxide (e.g., $SiO_2$) or poly. The layer 44 may have a thickness of, for example, about 100 nm and can be deposited by any suitable conformal deposition process. The dummy gates 20 are shown prior to application of the HM layers 22 to form the gate precursor structures 19A. The additional gate precursor structures 19B (not shown) can be formed in the portion of the wafer 10 between the structures 42.

Figure 2A:
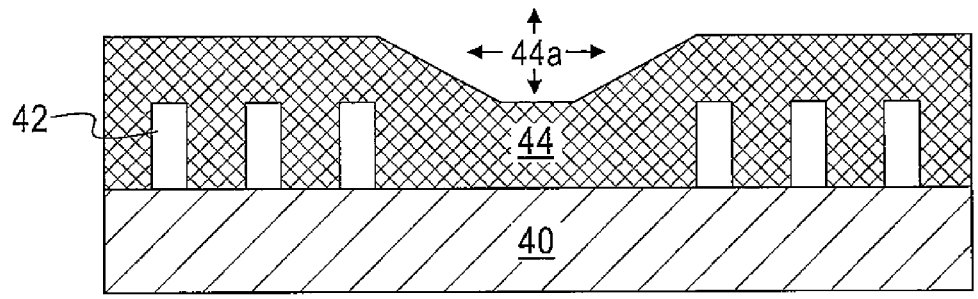
FIGS. 2A-2D, collectively referred to as FIG. 2, show a portion of the wafer at a post-dummy gate deposition processing point and illustrate a first embodiment of this invention.
Figure 2B:
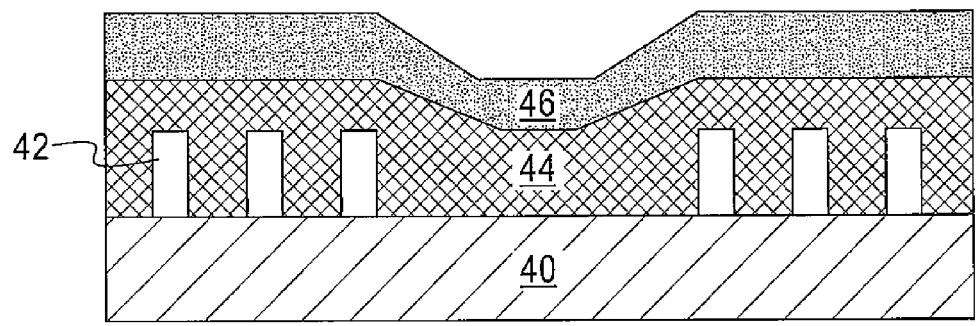

FIG. 2A shows in cross-section (not to scale) the portion of the wafer 10. Due to the presence of the structures 42 the blanket-deposited material 44 exhibits a non-planar surface topology characterized by a depression 44A between those portions of the wafer where the structures 42 (FINS) are disposed. Note that in this region where the depression 44A exists there can be other structures contained within the material 44 such as, but not limited to, one or more of the dummy gates 20 used to form auxiliary gates FIG. 2B shows the result of a conformal deposition of a layer 46 such as a nitride, e.g., $Si_3N_4$. The layer 46 can be deposited using any conventional process such as chemical vapor deposition (CVD), plasma enhanced CVD (PECVD) or low pressure CVD (LPCVD) as non-limiting examples. The layer 46 may have a thickness in the range of, by example, about 30 nm to about 100 nm.

Figure 2C:
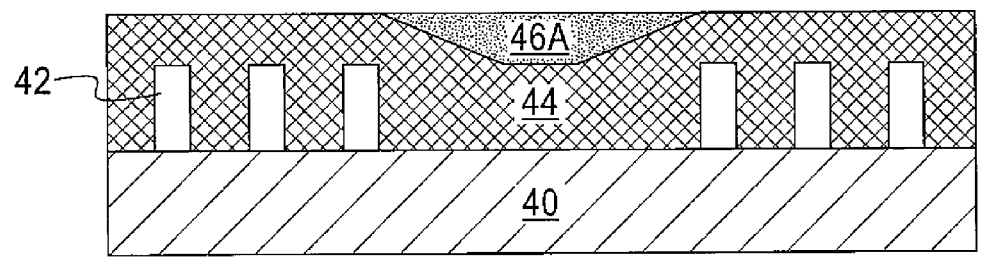

FIG. 2C shows a result of a CMP of the layer 46 (e.g., CMP of the $Si_3N_4$ nitride layer 46) that is selective to the surface of the oxide (or poly) layer 44. As a result there exists a portion 46A of the nitride layer 46 within that portion of the oxide layer 44 between the structures 42, i.e., in the depression 44A.

Figure 2D:
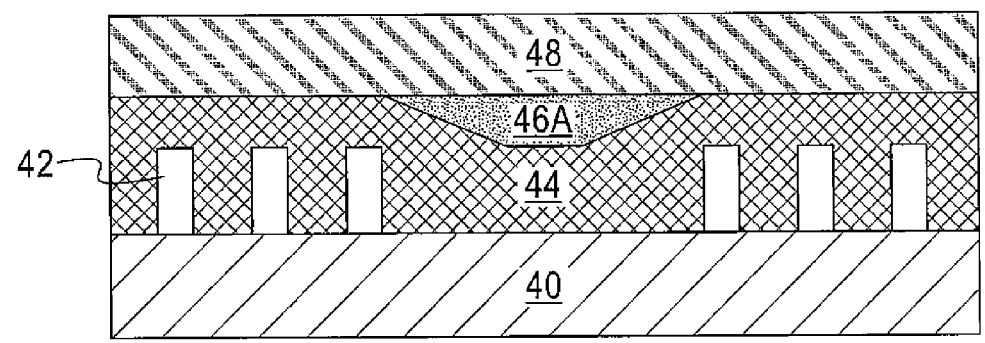

FIG. 2D shows a result of a conformal deposition of another nitride layer 48, e.g., another $Si_3N_4$ nitride layer, to a thickness of, for example, about 30 nm to about 100 nm. This nitride layer 48 is intended to form the hard mask (HM) layers 22 (see FIG. 1A) after patterning and surrounding nitride removal. Note that the resulting topology is essentially planar between the structures 42 such that any other structures, such as auxiliary gates, etc., between the structures 42 can be processed to form the RGM without incurring the detrimental "puddle" 24A of the material of the GM 24 shown in FIG. 1B.

FIG. 3 shows a second embodiment of this invention. FIGS. 3A and 3B can represent processing that is identical to the processing depicted in FIGS. 2A and 2B. In this exemplary embodiment the layer 44 can be a layer of polysilicon.

Figure 3A:
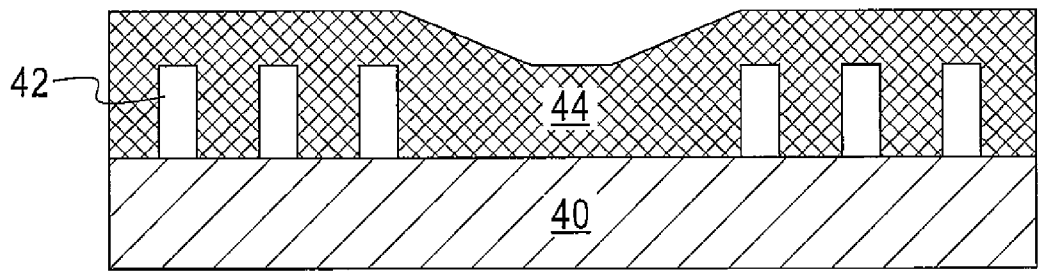
FIGS. 3A-3F, collectively referred to as FIG. 3, show the portion of the wafer at the post-dummy gate deposition processing point and illustrate a second embodiment of this invention.
Figure 3B:
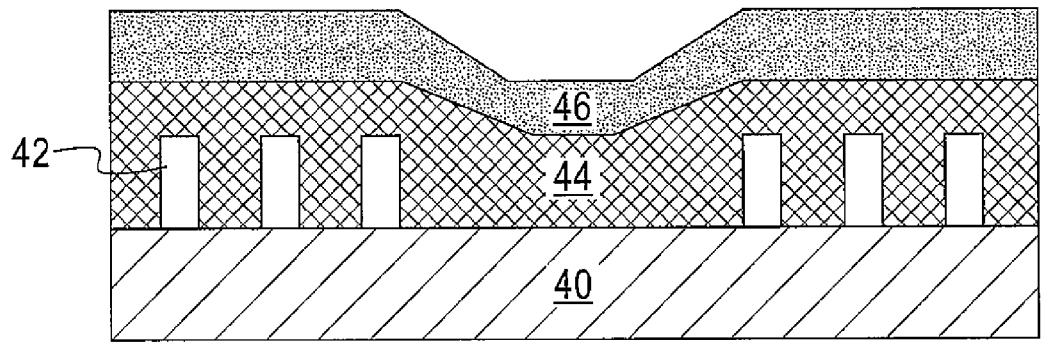
Figure 3C:
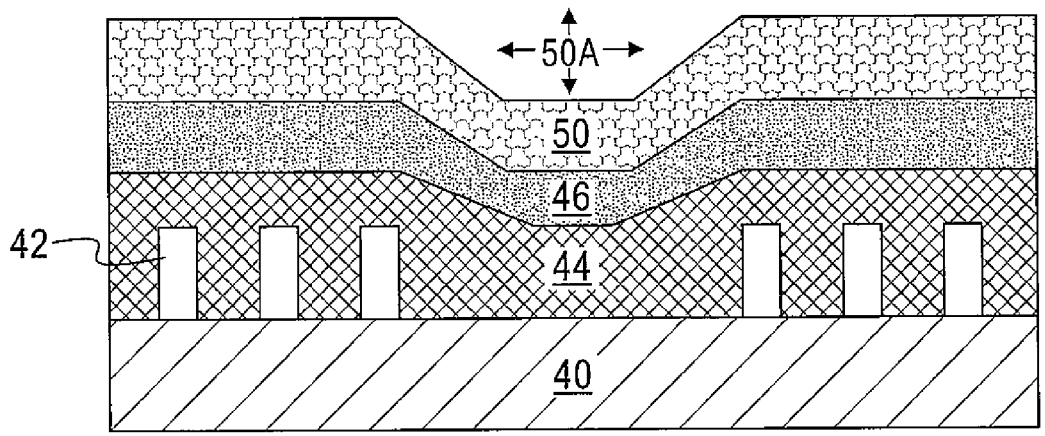

In FIG. 3C a layer of oxide 50, e.g., $SiO_2$, is conformally deposited over the nitride layer 46. Due to the presence of the structures 42, and the presence of the non-planar nitride layer 46, the oxide layer 50 also exhibits a non-planar surface topology characterized by a depression 50A. The layer 50 can be deposited using any conventional oxide-on-nitride deposition process including, as examples, CVD, PECVD or LPCVD. The oxide layer 50 may have a thickness in the range of, by example, about 30 nm to about 100 nm.

It is noted with regard to this embodiment that the CMP of an oxide layer can be more readily accomplished than the CVD of a nitride layer.

Figure 3D:
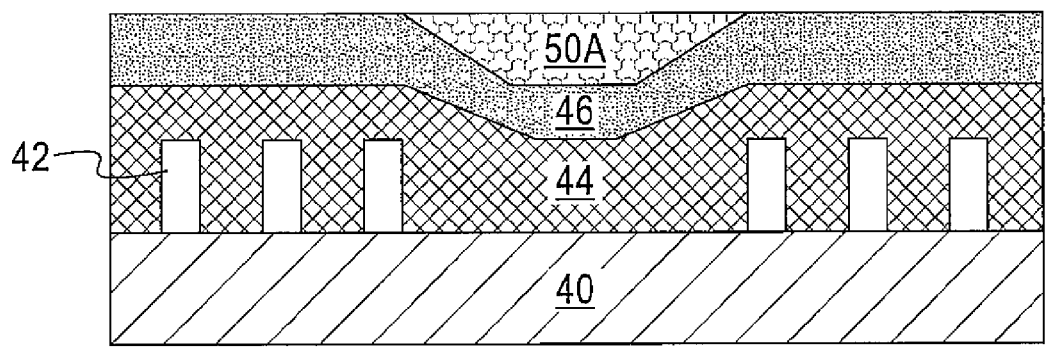

FIG. 3D shows a result of the CMP of the layer 50 (e.g., CMP of the SiO$_2$ layer 50) that is selective to and stops at the surface of the nitride layer 46. As a result there exists a portion 50A of the oxide layer 50 within that portion of the nitride layer 46 between the structures 42.

Figure 3E:
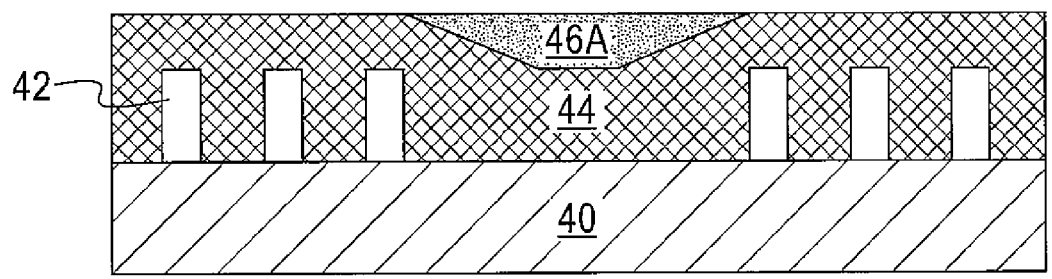

FIG. 3E shows a result of an oxide/nitride (wet or dry) etch with a (~1:1) etch rate selective to the poly layer 44. As a result of the performance of the oxide/nitride etch process there exists the portion 46A of the nitride layer 46 within that portion of the poly layer 44 between the structures 42. A fluorine-based reactive ion etch (RIE) process can be used, such as one employing CF$_4$ or HF, to accomplish the oxide/nitride etch.

Figure 3F:
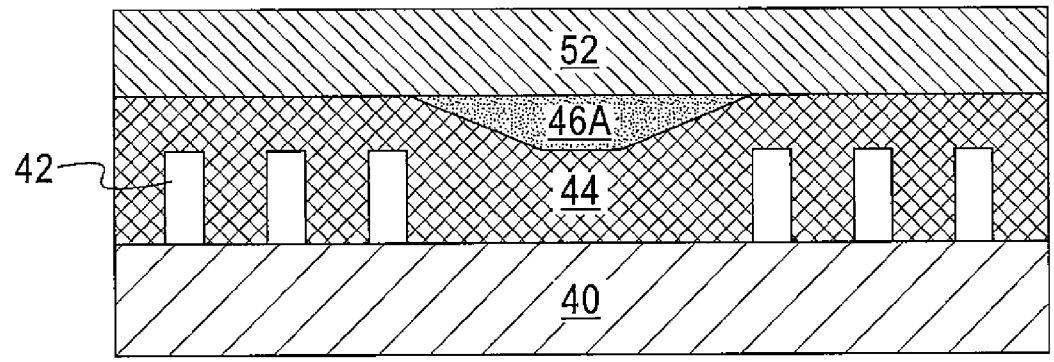

FIG. 3F shows a result of a conformal deposition of another nitride layer 52, e.g., another Si$_3$N$_4$ layer, to a thickness of, for example, about 30 nm to about 100 nm. As in the embodiment shown in FIG. 2D this nitride layer 52 is intended to form the hard mask (HM) layers 22 after patterning and surrounding nitride removal. Note again that the resulting topology is essentially planar between the structures 42 such that any other structures, such as auxiliary gates, etc., between the structures 42 can be processed to form the RGM without incurring the detrimental formation of the GM puddle 24A shown in FIG. 1B.

In the embodiments depicted in FIGS. 2 and 3, which can be referred to for convenience as depicting the fabrication of the intermediate semiconductor device structures in FIGS. 2D and 3F, additional processing is accomplished to, for example, pattern the layers 48 and 52 to form the HMs 22, remove the HMs and underlying dummy gate plugs, deposit the gate conductor (or conductors if a multi-conductor metal system is used), form the S/Ds 18, form contact metallization, etc., and to perform any other needed processing in whatever order to fabricate desired circuitry.

It should be appreciated that in addition to the foregoing methods an aspect of this invention provides an intermediate wafer structure that comprises a substrate, e.g., an SOI substrate having a surface upon which a structure is disposed. The intermediate wafer structure further comprises a first dummy gate plug disposed upon the structure; a second dummy gate plug disposed upon the substrate surface and a first layer (e.g., the oxide or poly layer 44) in which the first dummy gate plug and the second dummy gate plug are embedded. The first layer exhibits a non-planar surface topography characterized by a depression due at least to a presence of the first dummy gate plug that is disposed upon the structure. The intermediate wafer structure further comprises a second layer 46A comprised of a material that fills the depression to the surface of the first layer; and a third layer 52 overlying the first layer and the second layer. The third layer is comprised of a hard mask material such as a nitride and has a substantially planar surface topography over the first dummy gate plug, over the second dummy gate plug, and over the depression that is filled with the material of the second layer. The substantially planar surface topography beneficially facilitates performance of a subsequent gate metal deposition process used during replacement metal gate processing. The structure disposed on the surface can be FIN in some non-limiting embodiments.

The exemplary embodiments of this invention have been described in the context of FINFET structures whose presence on the wafer results in the non-planar surface topology. However it should be appreciated that the presence of any type of structure that would result in the creation of a non-planar surface topography on a wafer being processed can be addressed by the use of embodiments of this invention. For example, in other embodiments of this invention the wafer could contain nanowire devices. In general, the wafer can contain any structure or structures and planar devices whose presence can affect the surface topography of the wafer such that the surface topography would not be substantially planar and substantially uniform across the wafer.

The embodiments of this invention have been described in the context of SOI substrates, ETSOI substrates as well as in the context of bulk Si substrates. It should be appreciated that other types of semiconductor substrates, such as Group III-V and Group II-VI substrate materials, could benefit from the use and application of the embodiments of this invention.

Furthermore, it can be appreciated that there may be additional layers present in the structures described above, for example there could be one or more gate insulator layers present between the dummy gate plug and the underlying material of the FIN.

Furthermore the various CMP processes can be carried out using any conventional and suitable materials, slurries, pad pressures and the like. For example it is known that zirconia and silica abrasives can be during the CMP of silicon nitride, and that ceria and titania can be used during the CMP of silicon oxide.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended. to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent semiconductor fabrication processes, including deposition processes, etching processes may be used by those skilled in the art. Further, the exemplary embodiments are not intended to be limited to only those materials, metals, insulators, dopants, dopant concentrations, layer thicknesses and the like that were specifically disclosed above. Any and all such and similar modifications of the teachings of this invention will still fall within the scope of this invention.

What is claimed is:

1. An intermediate wafer comprising:
a substrate having a dielectric layer disposed thereon, the dielectric layer having a surface upon which a structure is disposed, the structure comprised of a fin formed from a patterned portion of a silicon on insulator (SOI) layer that is disposed upon and in contact with the surface of the dielectric layer, the fin having a top surface disposed at a height (h) above the surface of the dielectric layer;

a first dummy gate plug disposed upon the top surface of the fin;

a second dummy gate plug disposed upon the surface of the dielectric layer, where a top surface of the first dummy gate plug is disposed above a top surface of the second dummy gate plug by at least the height (h);

a first layer in which the first dummy gate plug and the second dummy gate plug are embedded, the first layer having a surface exhibiting a non-planar surface topography characterized by a depression due at least to a presence of the first dummy gate plug that is disposed upon the top surface of the fin;

a second layer comprised of a material that fills the depression in the surface of the first layer, the second layer having a first surface in contact with the surface of the first layer only within the depression, the second layer having a second surface that is substantially coplanar with the surface of the first layer; and a third layer overlying and in contact with the surface of the first layer and in contact with the second surface of the second layer, the third layer being comprised of a hard mask material, the third layer having a substantially planar surface topography over the first dummy gate plug, over the second dummy gate plug, and over the depression that is filled with the material of the second layer.

2. The intermediate wafer of claim 1, where the second layer and the third layer are both comprised of a nitride.

3. The intermediate wafer of claim 2, where the first layer is comprised of an oxide or of polysilicon.

4. An intermediate wafer comprising:
a substrate comprised of a bulk semiconductor substrate, the substrate having a surface upon which a nanowire structure is disposed, the nanowire structure having a top surface disposed at a height (h) above the surface of the substrate;

a first dummy gate plug disposed upon the top surface of the nanowire structure;

a second dummy gate plug disposed directly upon the surface of the substrate;

a first layer in which the first dummy gate plug and the second dummy gate plug are embedded, the first layer having a surface exhibiting a non-planar surface topography characterized by a depression due at least to a presence of the first dummy gate plug that is disposed upon the top surface of the nanowire structure;

a second layer comprised of a material that fills the depression in the surface of the first layer, the second layer having a first surface in contact with the surface of the first layer only within the depression, the second layer having a second surface that is substantially coplanar with the surface of the first layer; and a third layer overlying and in contact with the surface of the first layer and in contact with the second surface of the second layer, the third layer being comprised of a hard mask material, the third layer having a substantially planar surface topography over the first dummy gate plug, over the second dummy gate plug, and over the depression that is filled with the material of the second layer.

5. The intermediate wafer of claim 4, where the second layer and the third layer are both comprised of a nitride.

6. The intermediate wafer of claim 4, where the first layer is comprised of an oxide or of polysilicon.

* * * * *